United States Patent
Chen et al.

(10) Patent No.: US 9,281,331 B2
(45) Date of Patent: Mar. 8, 2016

(54) HIGH DIELECTRIC CONSTANT STRUCTURE FOR THE VERTICAL TRANSFER GATES OF A COMPLEMENTARY METAL-OXIDE SEMICONDUCTOR (CMOS) IMAGE SENSOR

(71) Applicant: Taiwan Semiconductor Manufacturing Co., Ltd., Hsin-Chu (TW)

(72) Inventors: Sheng-Chau Chen, Tainan (TW); Chih-Yu Lai, Tainan (TW); Kuo-Ming Wu, Zhubei (TW); Kuo-Hwa Tzeng, Taipei (TW); Cheng-Hsien Chou, Tainan (TW); Cheng-Yuan Tsai, Chu-Pei (TW); Yeur-Luen Tu, Taichung (TW); Chia-Shiung Tsai, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/308,910

(22) Filed: Jun. 19, 2014

(65) Prior Publication Data
US 2015/0372034 A1     Dec. 24, 2015

(51) Int. Cl.
*H01L 31/062*    (2012.01)
*H01L 27/146*    (2006.01)
*H01L 29/51*    (2006.01)
*H01L 29/423*    (2006.01)
*H01L 21/02*    (2006.01)
*H01L 29/66*    (2006.01)
(Continued)

(52) U.S. Cl.
CPC ...... *H01L 27/14614* (2013.01); *H01L 21/0228* (2013.01); *H01L 21/02181* (2013.01); *H01L 21/02266* (2013.01); *H01L 21/308* (2013.01); *H01L 21/30604* (2013.01); *H01L 27/1463* (2013.01); *H01L 27/14643* (2013.01); *H01L 27/14689* (2013.01); *H01L 29/4236* (2013.01); *H01L 29/42364* (2013.01); *H01L 29/517* (2013.01); *H01L 29/66613* (2013.01)

(58) Field of Classification Search
CPC ............. H01L 27/14603; H01L 27/14609; H01L 27/14643; H01L 27/14689; H01L 27/14614; H01L 27/1463; H01L 21/02181; H01L 21/02286; H01L 21/0228; H01L 21/30604; H01L 21/308; H01L 29/4236; H01L 29/42364; H01L 29/517; H01L 29/66613
USPC .............. 257/292, 225, 72; 438/437; 348/308
See application file for complete search history.

(56) References Cited

U.S. PATENT DOCUMENTS 4,760,273 A *  7/1988 Kimata .................. 250/208.1
7,217,968 B2 * 5/2007 Adkisson et al. ............. 257/292
(Continued)

OTHER PUBLICATIONS

U.S. Appl. No. 14/163,944, filed Jan. 24, 2014.
(Continued)

*Primary Examiner* — Mohammed Shamsuzzaman
(74) *Attorney, Agent, or Firm* — Eschweiler & Associates, LLC

(57) ABSTRACT

A vertical-gate transfer transistor of an active pixel sensor (APS) is provided. The transistor includes a semiconductor substrate, a vertical trench extending into the semiconductor substrate, a dielectric lining the vertical trench, and a vertical gate filling the lined vertical trench. The dielectric includes a dielectric constant exceeding 3.9 (i.e., the dielectric constant of silicon dioxide). A method of manufacturing the vertical-gate transfer transistor, an APS including the vertical-gate transfer transistor, a method of manufacturing the APS, and an image sensor including a plurality of the APSs are also provided.

12 Claims, 7 Drawing Sheets

(51) Int. Cl.
*H01L 21/306* (2006.01)
*H01L 21/308* (2006.01)

(56) References Cited

U.S. PATENT DOCUMENTS

| | | | |
|---|---|---|---|
| 2004/0043581 A1* | 3/2004 | Lin et al. | 438/437 |
| 2004/0262609 A1* | 12/2004 | Mouli et al. | 257/72 |
| 2012/0080732 A1* | 4/2012 | Anderson et al. | 257/292 |
| 2013/0221410 A1* | 8/2013 | Ahn | 257/225 |
| 2013/0321685 A1* | 12/2013 | Ahn et al. | 348/308 |

OTHER PUBLICATIONS

Wikipedia.org. "High-K Dielectric." May 29, 2015.
U.S. Appl. No. 14/308,910, filed Jan. 24, 2014.

\* cited by examiner

HIGH DIELECTRIC CONSTANT STRUCTURE FOR THE VERTICAL TRANSFER GATES OF A COMPLEMENTARY METAL-OXIDE SEMICONDUCTOR (CMOS) IMAGE SENSOR

BACKGROUND

Digital cameras and optical imaging devices employ image sensors. Image sensors convert optical images to digital data that may be represented as digital images. Image sensors include an array of pixels, which are unit devices for the conversion of an optical image into digital data. The pixels often manifest themselves as charge-coupled devices (CCDs) or complementary metal oxide semiconductor (CMOS) devices.

CMOS image sensors (CISs) have recently received more attention than CCD image sensors. CISs provide lower power consumption, smaller size, and faster data processing than CCD image sensors. Further, CISs provide a direct digital output of data that is not available in CCD image sensors. Even more, CISs have a lower manufacturing cost compared with CCD image sensors, since many standard semiconductor manufacturing processes may be employed to manufacture CISs. For these reasons, commercial employment of CISs has been steadily increasing in recent years.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
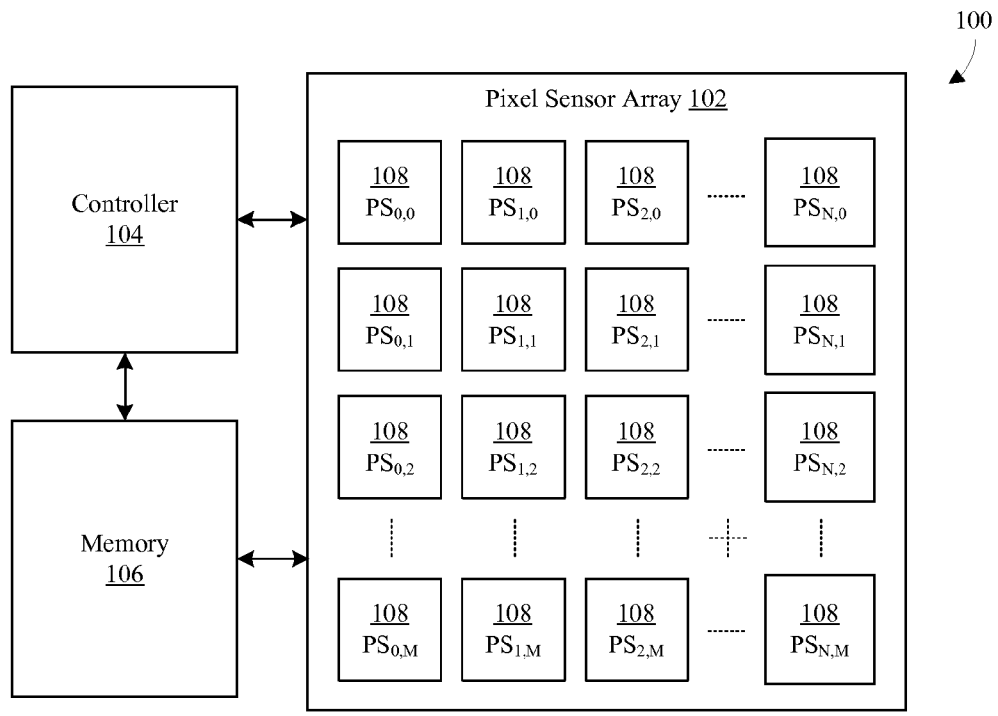
FIG. 1 illustrates a complementary metal oxide semiconductor (CMOS) image sensor (CIS) including an array of pixel sensors using vertical-gate transfer transistors insulated by a high κ gate dielectric (i.e., a gate dielectric with a dielectric constant κ greater than 3.9).

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Many portable electronic devices, such as cameras, cellular telephones, personal digital assistants (PDAs), MP3 players, computers and other devices, include an image sensor for capturing images. One example of such an image sensor is a complementary metal-oxide semiconductor (CMOS) image sensor (CIS) including an array of active pixel sensors (APSs). An APS records the intensity of incident light using a photodetector, typically a photodiode, and corresponds to a pixel of the CIS. A pixel is the smallest area to which recorded light can be localized on the focal plane of the CIS. An APS is active in that it includes an active amplifier amplifying measured light.

Some types of APS, such as a four transistor (4T) APS, include a transfer transistor for transferring charge accumulated by a photodiode to a charge storage node to readout the accumulated charge. In the past, the transfer gates of such transistors were insulated by an oxide, typically silicon dioxide (SiO2). However, an oxide suffers from a number of drawbacks. An oxide cannot further improve performance of a transfer transistor for future node shrinkage. Performance pertains to how much charge can pass through the transfer transistor and affects how fast the APS can be read out. Oxides have reached the limits of oxides in that the thickness of gate insulating oxides cannot be further reduced to improve performance without substantially increasing leakage current. Further, etching using an oxide often leads to sidewall damage in the transfer transistor of an APS. Such damage can increase electron-hole recombination, as well as increase the dark current (DC) of the associated photodiode. In some instances, this damage can even lead to a white pixel (WP) (i.e., a saturated photodiode).

In view of the foregoing, the present disclosure is directed to an improved semiconductor structure for a transfer transistor of an APS, and more specifically an improved semiconductor structure for a transfer gate of an APS. As discussed in greater detail hereafter, the improved semiconductor structure employs a dielectric with a high dielectric constant κ (relative to silicon dioxide (SiO2)) for insulating the transfer gate. A high dielectric constant κ is a dielectric constant exceeding 3.9 (i.e., the dielectric constant κ of SiO2). Further, the improved semiconductor structure employs a vertical transfer gate. The improved semiconductor structure advantageously improves gate performance and decreases leakage current of the vertical transfer gate. Further, the improved semiconductor structure advantageously provides increased sidewall protection to reduce electron-hole recombination and the dark current of the photodiode. Even more, the improved semiconductor structure advantageously allow increased pixel sensor density in the array due to the vertical orientation of the transfer gate.

With reference to FIG. 1, a CIS 100 according to some embodiments is provided. The CIS 100 includes a pixel sensor array 102, a controller 104, and a memory 106. Typically, the pixel sensor array 102, the controller 104, and the memory 106 are integrated into an integrated circuit. The pixel sensor array 102 includes an array of one or more individual pixel sensors 108 arranged in a series of N>0 rows and M>0 columns. For example, the pixel sensor array 102 can include N=2448 and M=3264, as is common for modern 8 megapixel cameras. For readability, the individual pixel sensors 108 are labeled according to the following naming convention: $PS_{<column, row>}$. The individual pixel sensors 108 include corresponding vertical-gate transfer transistors and corresponding photodiodes. As discussed in greater detail hereafter, the photodiodes record the intensity of light incident thereon, and the vertical-gate transfer transistors facilitate read-out of the recordings. In contrast with known pixel sensors, the vertical-gate transfer transistors 110 employ vertical transfer gates insulated by a high κ dielectric (i.e., a dielectric with a dielectric constant greater than 3.9).

Because photodiodes are naturally "color blind" (i.e., photodiodes cannot distinguish between light of different colors), the CIS 100 typically includes or is otherwise associated with a color filter array (not shown). The color filter array is a mosaic of tiny color filters placed over the pixel sensor array 102 to assign colors to the individual pixel sensors 108. A commonly used color filter array is the Bayer filter. The Bayer filter includes a mosaic of red, green and blue filters arranged in a filter pattern of 50% green, 25% red, and 25% blue. Such an arrangement of filters is advantageous because red, green, and blue can be mixed in different combinations to produce most of the colors visible to the human eye.

During image capture, a camera shutter (not shown) is opened to expose the pixel sensor array 102 to an optical image for a predetermined period time. Over this period of time, the individual pixel sensors 108 record light impingent at their respective array locations to generate image data. After the predetermined period of time, the image data is transferred and stored in the memory 106. The controller 104 then gathers all the image data, and determines the light intensity recorded at each individual pixel sensor 108 to reconstruct a digital representation of the optical image. To obtain a full-color image, various demosaicing algorithms can, for example, be used to interpolate a set of complete red, green, and blue values for each pixel. In this way, color images can be digitally recorded so device users can share the images on a computer, share them with friends, and the like.

Figure 2:
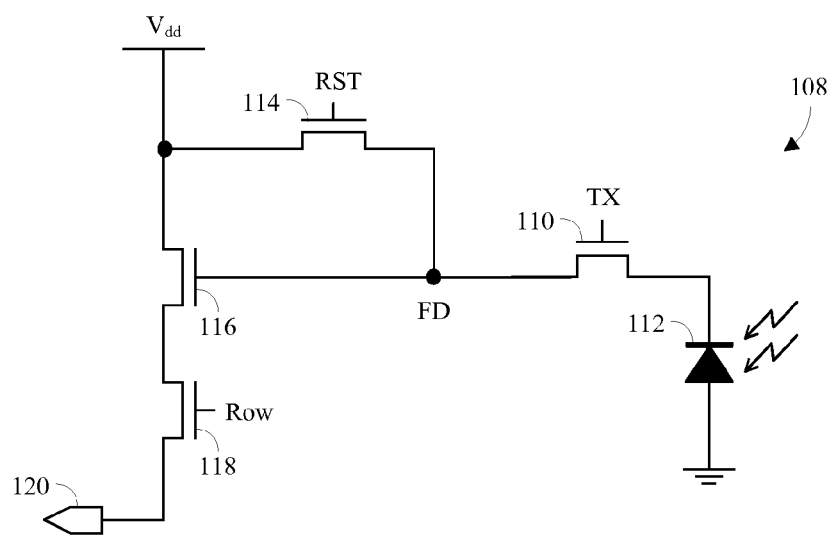
FIG. 2 illustrates a circuit diagram of a pixel sensor using a vertical-gate transfer transistor insulated by a high κ gate dielectric.

With reference to FIG. 2, a circuit diagram of a pixel sensor 108 according to some embodiments is provided. As shown, each pixel sensor 108 includes a vertical-gate transfer transistor 110, a photodiode 112, a reset transistor 114, a source-follower transistor 116, and a row select transistor 118. The photodiode 112 converts light incident on the photodiode 112 to electric charge proportional to the intensity of the light. The vertical-gate transfer transistor 110 is arranged between the photodiode and a charge storage node (also known as a floating diffusion (FD) node) to selectively transfer charge from the photodiode 112 to the charge storage node. The reset transistor 114 is connected between power (e.g., $V_{dd}$) and the charge storage node to selectively clear charge at the charge storage node. The source-follower transistor 116 is connected between power and the row select transistor 118, and gated by the charge storage node, to allow the voltage at the charge storage node to be observed without removing the accumulated charge. The row select transistor 118 is connected between the source-follower transistor 116 and an output 120 of the pixel sensor 108 to selectively output a voltage proportional to the voltage at the charge storage node.

With reference to both FIGS. 1 and 2, during use of the pixel sensor array 102, the pixel sensor array 102 is exposed to an optical image for a predetermined integration period. Over this period of time, the individual pixel sensors 108 record the intensity of light incident on the photodiodes 112 to generate image data. More specifically, light incident on the photodiodes 112 causes the accumulation of charge in proportion to the light intensity.

After the predetermined integration period, the image data is acquired from the pixel sensor array 102 one row at a time and stored in the memory 106. The image data for a row is transferred by first selecting the row and clearing the accumulated charge at the charge storage nodes of the row. The row can be selected by activating the row select transistors 118 (e.g., pulling the gate high) of the row. The charge storage nodes can be cleared by, for example, momentarily activating the reset transistors 114 (e.g., pulsing the gates high) to couple the charge storage nodes to power. Thereafter, the accumulated charge of the photodiodes 112 is transferred to the charge storage nodes by activating the vertical-gate transfer transistor 110 (e.g., pulling the vertical transfer gates high) of the row for a predetermined transfer period.

During the predetermined transfer period, the voltages output by the pixel sensors 108 of the row are monitored. As a charge storage node accumulates charge, its voltage is pulled down, thereby tending to turn off the source-follower transistor 116 and reducing voltage output by the pixel sensor 108. After the predetermined transfer period, the change in voltage due to the transfer is employed to determine the intensity of light detected by the pixel sensor 108.

Figure 3:
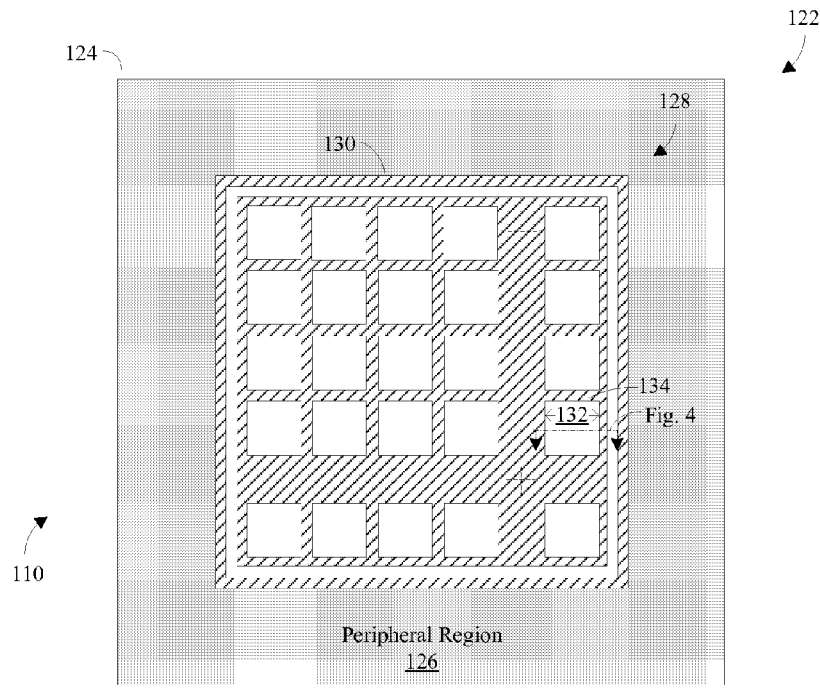
FIG. 3 illustrates a top level view of a CIS semiconductor structure including an array of pixel sensors using vertical-gate transfer transistors insulated by a high κ gate dielectric.

With reference to FIG. 3, a top level view of a semiconductor structure 122 for the CIS 100 according to some embodiments is provided. The semiconductor structure 122 forms an integrated circuit in some embodiments. The semiconductor structure 122 includes a semiconductor substrate 124 upon and/or within which the CIS 100 is formed. The semiconductor substrate 124 is typically planar with a uniform thickness. Further, the semiconductor substrate 124 is n- or p-type, and can, for example, be a bulk silicon substrate or a silicon-on-insulator (SOI) substrate. If present, an SOI substrate is often made up of an active layer of high quality silicon in which the pixel sensors 108 are formed. In such instances, the pixel sensors are often arranged over a buried layer (BOX) of electrically insulating silicon dioxide, which is arranged over a bulk silicon support substrate.

At the periphery of the semiconductor structure 122, the semiconductor structure 122 includes a peripheral region 126 where a controller 104 (see FIG. 1), a memory 106 (see FIG. 1), and any other logic needed for image capture are located. At the core (e.g., center) of the semiconductor structure 122, the semiconductor structure 122 includes a core region 128 where a pixel sensor array 102 (see FIG. 1) is located. To isolate the core region 128 from the peripheral region 126 (i.e., to prevent electrical current leakage), the semiconductor structure 122 includes a peripheral isolation region 130 surrounding the core region 128. The peripheral isolation region 130 can manifest as, for example, a deep trench isolation (DTI) region and/or a shallow trench isolation region (STI). The DTI region and/or STI region can manifest as a dielectric region buried in the semiconductor substrate 124, or as a doped region implanted into the semiconductor substrate 124 to limit charge flow. The peripheral isolation region 130, the controller 104, the memory 106, and any other logic needed for image capture can be formed on and/or within the semiconductor structure 122 using any semiconductor device fabrication technique.

Within the core region 128, the semiconductor structure 122 includes a plurality of pixel sensor regions 132 corresponding to the individual pixel sensors 108 of the pixel sensor array 102 (see FIG. 1). For readability, only a single pixel sensor region 132 is labeled. Each pixel sensor region 132 includes the components (see FIG. 1) of a pixel sensor 108; namely, a photodiode 112, a vertical-gate transfer transistor 110, a reset transistor 114, a source-follower transistor 116, and a row select transistor 118. To isolate the individual pixel sensor regions 132 from each other, each pixel sensor region 132 is surrounded by a pixel STI region 134. Typically, the pixel STI regions 134 are shallower than the peripheral isolation region 130 (as illustrated, for example), but in other embodiments the pixel STI regions 134 and peripheral isolation region 130 can have the same depth. The pixel STI region 134 can manifest as, for example, a dielectric region buried in the semiconductor substrate 124, or a doped region implanted into the semiconductor substrate 124 to limit charge flow. For readability, only a single pixel STI region 134 is labeled. The pixel STI region 134 and the individual pixel sensors 108 can be formed on and/or within the semiconductor structure 122 using any semiconductor device fabrication technique.

Figure 4:
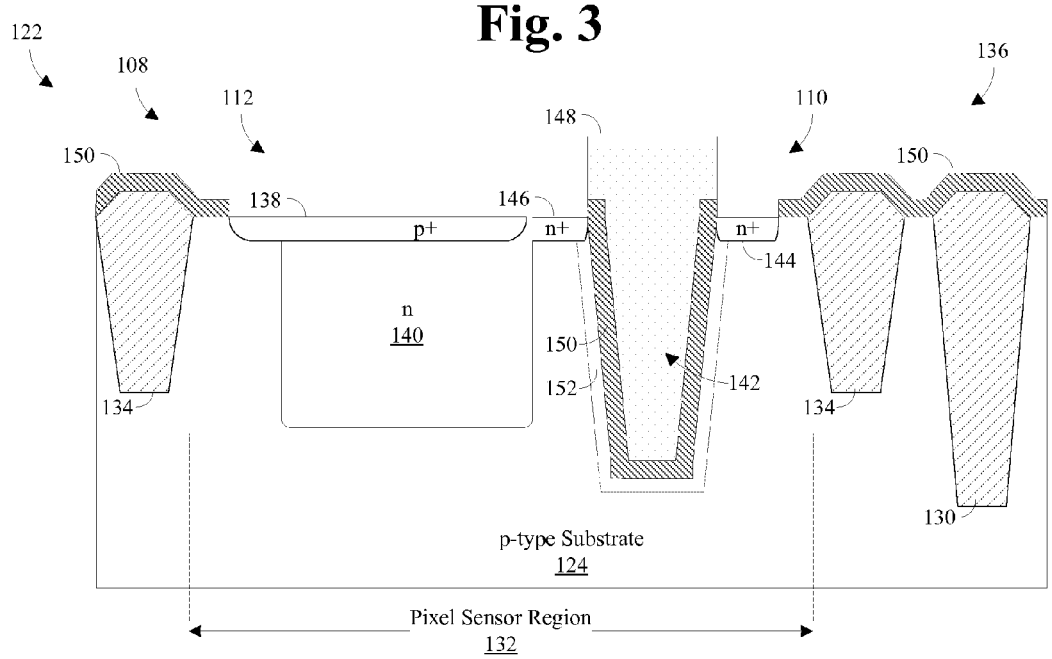
FIG. 4 illustrates a cross sectional view of a semiconductor structure of a pixel sensor including a vertical-gate transfer transistor insulated by a high κ gate dielectric.

With reference to FIG. 4, a cross sectional view of a portion 136 of the semiconductor structure 122 according to some embodiments is provided. The portion 136 is extracted from the periphery of the semiconductor structure 122 and illustrates the peripheral isolation region 130 and the pixel STI region 134 of an individual pixel sensor 108. The portion 136 further illustrates a portion of the core region 132 of the individual pixel sensor 108. This portion includes the photodiode 112 and the vertical-gate transfer transistor 110 of the individual pixel sensor 108.

The photodiode 112 includes an anode region 138 and a cathode region 140 embedded within the surface of the semiconductor substrate 124. The anode and cathode regions 138, 140 are of opposite types (n- or p-type) with the anode region 138 typically being p-type and the cathode region 140 typically being n-type. Typically, as illustrated, the anode region 138 is at least partially embedded within the cathode region 140 to form a p-n junction. The cathode region 140 is connected to the transfer transistor 110, and the anode 138 is connected to ground.

The vertical-gate transfer transistor 110 includes a vertical trench 142 extending into the semiconductor substrate 124. The vertical trench 142 is vertical in the sense that it extends approximately perpendicular to a surface of the semiconductor structure 122. Typically, the depth of the vertical trench 142 (i.e., how far the vertical trench 142 extends into the semiconductor structure 122) exceeds the length and the width of the vertical trench 142. Disposed on opposite sides of the vertical trench 142, the vertical-gate transfer transistor 110 further includes a source region 144 and a drain region 146 embedded within the surface of the semiconductor substrate 124. The source and drain regions 144, 146 are of the same doping type and of the opposite doping type as the semiconductor substrate 124.

To activate the vertical-gate transfer transistor 110, the vertical-gate transfer transistor 110 includes a vertical transfer gate 148, such as a polysilicon or metal gate, filling the vertical trench 142. Lining the vertical trench 142 and separating the vertical transfer gate 148 from the semiconductor substrate 124, the vertical-gate transfer transistor 110 includes a high κ dielectric 150. The high κ dielectric 150 further lines the surface of the semiconductor substrate 124, optionally with discontinuities, as shown, for the photodiode 112 and the source and drain regions 144, 146. In contrast with prior art vertical-gate transfer transistors 110 employing a silicon dioxide dielectric, the high κ dielectric 150 is formed of one or more materials having a high κ dielectric constant κ (i.e., materials with dielectric constants greater than 3.9). For example, the high κ dielectric 150 can be one of, or otherwise include one or more of, hafnium oxide (HfO2), aluminum oxide (AlO3), and tantalum pentoxide (Ta2O5). The high κ dielectric 150 further includes a thickness of about 30-500 Angstroms (A) depending upon the desired gate performance and sidewall protection.

Advantageously, employing a high κ dielectric 150 allows the vertical-gate transfer transistor 110 to achieve a higher transfer rate from the photodiode 112 to the charge storage node, relative to a like transfer transistor instead employing silicon dioxide for gate insulation. More specifically, the high κ dielectric 150 passivates an adjacent region of the semiconductor substrate 124 overlapping an inversion channel region 152. Passivation provides electrical stability to the region by isolating the region from electrical and chemical conditions in the environment. The extent of the passivation is proportional to the thickness of the high κ dielectric 150. The passivation leads to a positive shift in the flat-band voltage $V_{FB}$, an increase in negative charge buildup in the inversion channel region 152, a lower interface-trap density $D_{it}$, and a steeper capacitance-voltage (CV) curve. Hence, the passivation by the high κ dielectric 150 allows the charge from the photodiode 112 to transfer to the charge storage node faster.

To more formalistically frame the transfer increase, note that the vertical-gate transfer transistor 110 can be modeled as a parallel plate capacitor:

$$C = \frac{\kappa \varepsilon_0 A}{t},$$

where C is the capacitance of the parallel plate capacitor, A is the capacitor area (i.e., the area of the vertical transfer gate 148), κ is the dielectric constant of the high κ dielectric 150, $\varepsilon_0$ is the permittivity of free space (i.e., $8.854 \times 10^{-12}$ farads per meter (F/m)), and t is the thickness of the capacitor insulator (i.e., the thickness of the high κ dielectric 150). Hence, the capacitance C is proportional to the dielectric constant k.

Further note that the maximum drain current $I_D$ for the vertical-gate transfer transistor 110 can be computed as follows:

$$I_D = \frac{W}{L} \mu C \frac{(V_G - V_{th})^2}{2},$$

where W is the width of the transistor channel, L is the channel length, μ is the channel carrier mobility (assumed constant here), C is the capacitance (computed as described above) of the vertical-gate transfer transistor 110, $V_G$ is the voltage applied to the vertical transfer gate 148, $V_D$ the voltage applied to the drain region 146 of the vertical-gate transfer transistor 110, and $V_{th}$ is the threshold voltage. Hence, the maximum drain current $I_D$ is proportional to the capacitance C and the dielectric constant κ, whereby employing a high κ dielectric 150 allows more current (i.e., charge per unit time) to be transferred.

Figure 5:
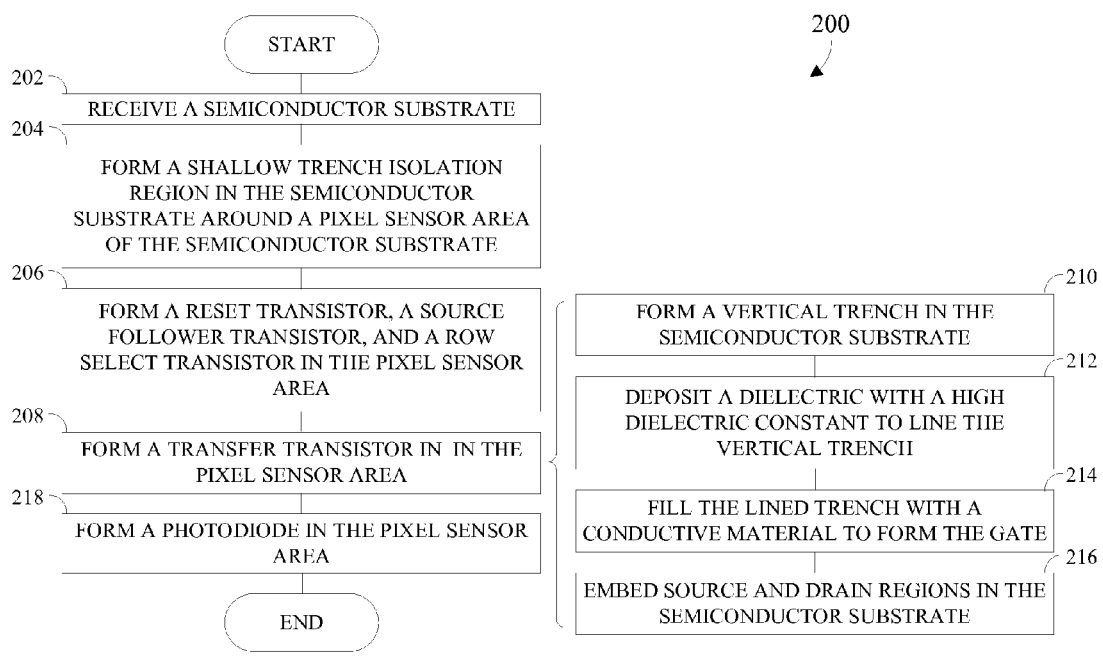
FIG. 5 illustrates a method of manufacturing a pixel sensor including a vertical-gate transfer transistor insulated by a high κ gate dielectric.

With reference to FIG. 5, a method 200 for manufacturing a pixel sensor 108 according to some embodiments is provided. In some embodiments, all or a subset of the method 200 is performed as part of the manufacture of an integrated circuit for one or more of a vertical-gate transfer transistor 110, a pixel sensor 108 and a CIS 100. For example, the CIS 100 or the vertical-gate transfer transistor 110 can be manufactured as an integrated circuit. In describing the method 200, reference is principally made to FIG. 4. However, FIGS. 6A-I are periodically referenced to illustrates intermediate stages of manufacture.

Figure 6A:
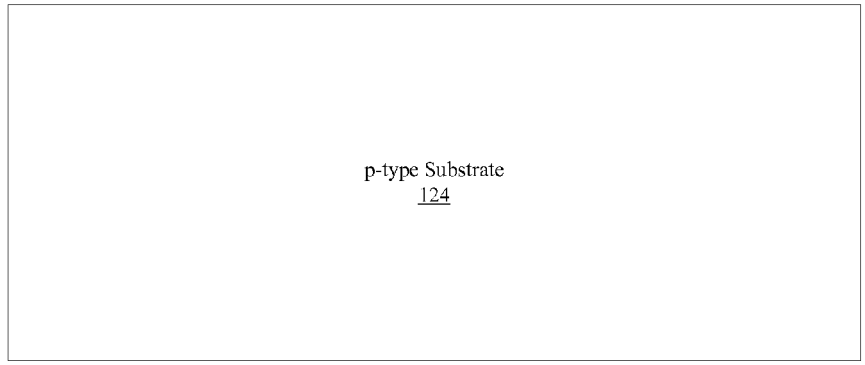
FIGS. 6A-I illustrate a sequence of cross sectional views of a pixel sensor including a vertical-gate transfer transistor insulated by a high κ gate dielectric at the various stages of manufacture.

According to the method 200, a semiconductor substrate 124 is received (Action 202). FIG. 6A illustrates a cross sectional view of the pixel sensor 108 at this stage of manufacture. As indicated above, the semiconductor substrate 124 is typically planar with a uniform thickness. Further, the semiconductor substrate 124 is n- or p-type, and can, for example, be a bulk silicon substrate or a SOI substrate. If present, an SOI substrate is often made up of an active layer of high quality silicon in which the pixel sensors 108 are formed. In such instances, the pixel sensors 108 are arranged over a BOX of electrically insulating silicon dioxide, which is arranged over a bulk silicon support substrate. In some instances, the semiconductor substrate 124 includes source and drain regions 144, 146 spaced apart and embedded in the surface of the semiconductor substrate 124.

Figure 6B:
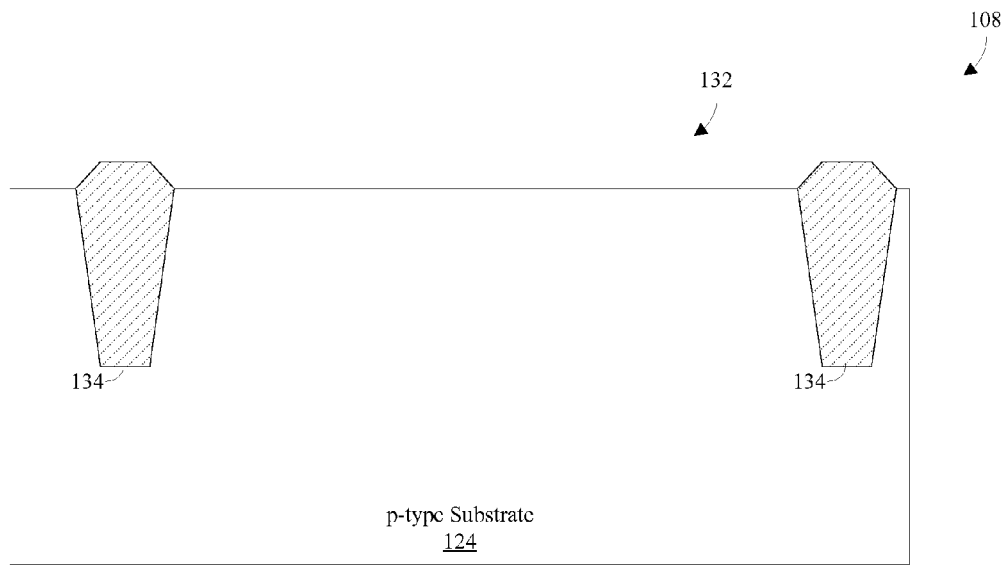

After receiving the semiconductor substrate 124, a pixel STI region 134 is formed (Action 204) in the semiconductor substrate 124 around a pixel sensor area 132 of the semiconductor substrate 124. FIG. 6B illustrates a cross sectional view of the pixel sensor 108 at this stage of manufacture. The specific approach by which the pixel STI region 134 is formed is beyond the scope of the present disclosure. However, it is to be understood that any approach can be employed. In some embodiments, the pixel STI region 134 is formed as a dielectric region buried in the semiconductor substrate 124, or as a doped region implanted into the semiconductor substrate 124.

A reset transistor 114, a source follower transistor 116, a row select transistor 118, and a transfer transistor 110 are also formed (Actions 206, 208) in the pixel sensor area 132. As shown in FIG. 2, the source follower transistor 116 and the row select transistor 118 are formed so they're connected in series between power $V_{dd}$ and an output 120. Further, the reset transistor 114 is formed so it's connected between power and a charge storage node, which connects to a gate of the source follower transistor 116. Even more, the transfer transistor 110 is formed so it connects the photodiode 112 to the charge storage node. The specific approach by which the reset transistor 114, the source follower transistor 116, and the row select transistor 118 are formed (Action 206) is beyond the scope of the present disclosure. However, it is to be understood that any approach can be employed.

Figure 6C:
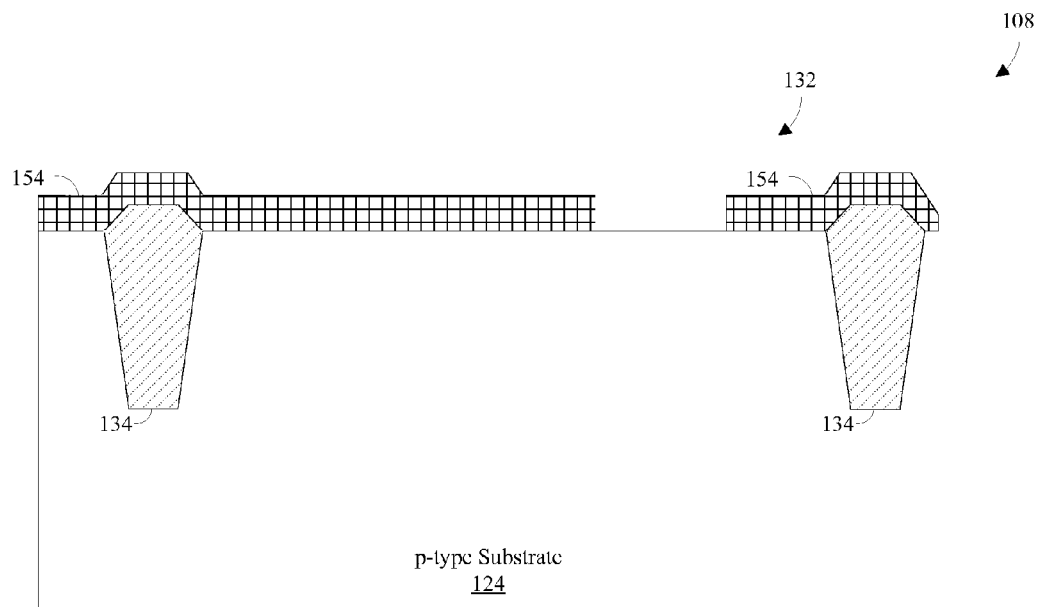
Figure 6D:
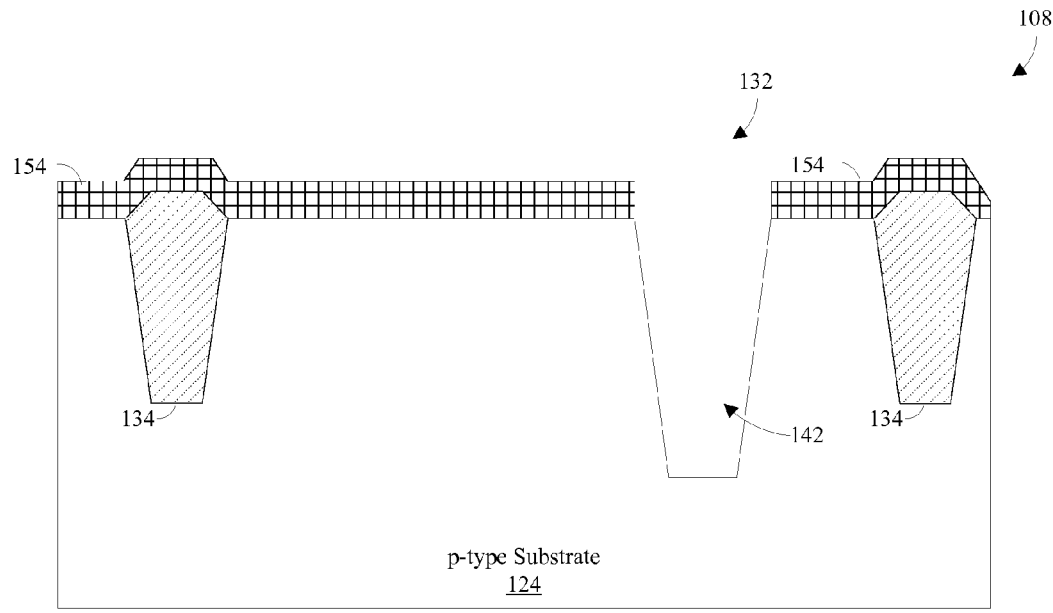

To form the transfer transistor 110 (Action 208), a vertical trench 142 is formed (Action 210) within the semiconductor substrate 124. The vertical trench 142 is typically formed by etching the semiconductor substrate 124. For example, in some embodiments, a layer of photoresist 154 (see FIG. 6C) is deposited on the semiconductor substrate 124. The photoresist 154 is then patterned using photolithography to identify the location of the vertical trench 142 on the semiconductor substrate 124. FIG. 6C illustrates a cross sectional view of the pixel sensor 108 at this stage of manufacture. With the photoresist 154 patterned, the semiconductor substrate 124 is etched (e.g., dry etched). FIG. 6D illustrates a cross sectional view of the pixel sensor 108 at this stage of manufacture. Finally, the remaining photoresist 154 is removed.

Figure 6E:
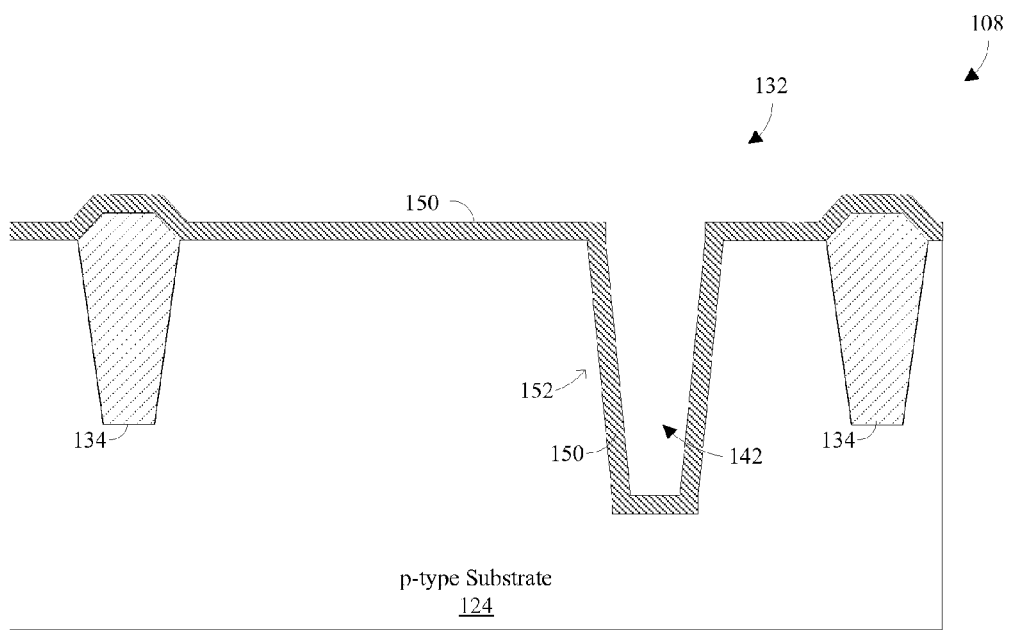

A high κ dielectric 150 (see FIG. 6E) is next deposited (Action 212) on the semiconductor substrate 124 to line the vertical trench 142 and isolate the vertical transfer gate 148 from the semiconductor substrate 124. Hence, the high κ dielectric 150 is deposited along the inversion channel region 152. FIG. 6E illustrates a cross sectional view of the individual pixel sensor 108 at this stage of manufacture. In some embodiments, while lining the trench, the surface of the semiconductor substrate 124 is coated with the high κ dielectric 150, as illustrated in FIG. 6E. In such embodiments, etching can subsequently be performed to remove peripheral portions (i.e., portions not lining the semiconductor substrate 124) of the high κ dielectric 150. Alternatively, etching can be performed to remove select portions of the high κ dielectric 150, such as only those portions above the photodiode 138.

The high κ dielectric 150 includes one or more materials with a dielectric constant κ exceeding that of silicon dioxide (i.e., a dielectric constant κ exceeding 3.9). Such materials include HfO2, AlO3, and Ta2O5. The high κ dielectric 150 further includes a thickness of about 30-500 A depending upon the desired gate performance and sidewall protection. In some instances, the high κ dielectric 150 is formed of a 60 nanometer (nm) layer of HfO2 deposited by atomic layer deposition (ALD). In other instances, the high κ dielectric 150 is formed of an 11 nm layer of HfO2 deposited by ALD and a 50 nm layer of HfO2 deposited by physical vapor deposition (PVD).

Figure 6F:
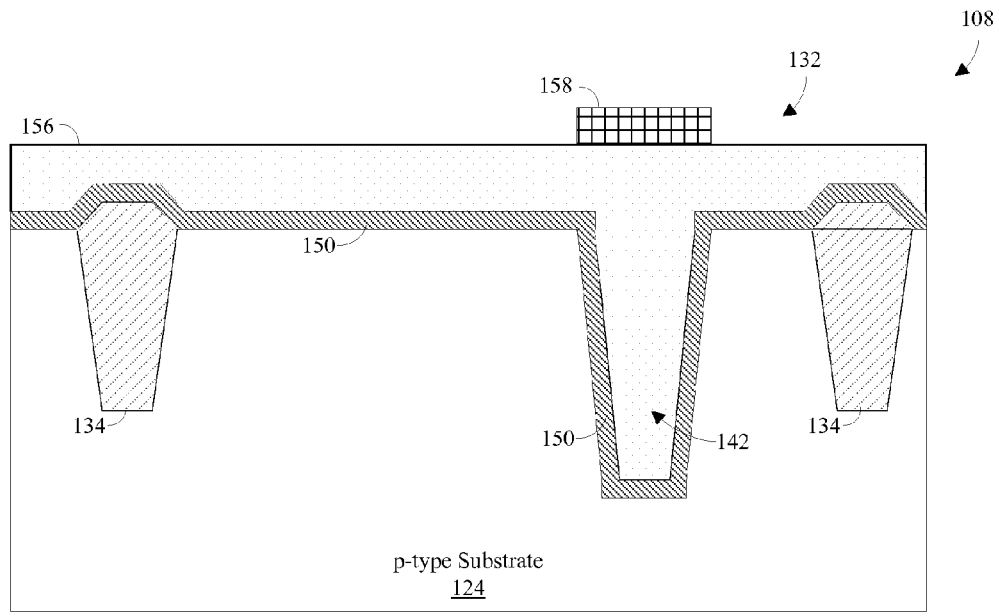
Figure 6G:
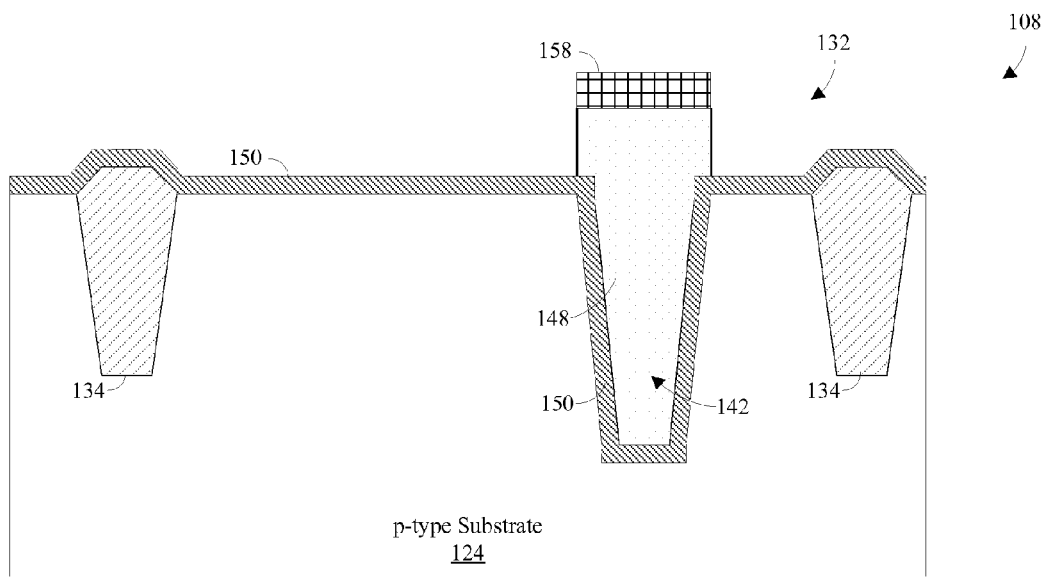
Figure 6H:
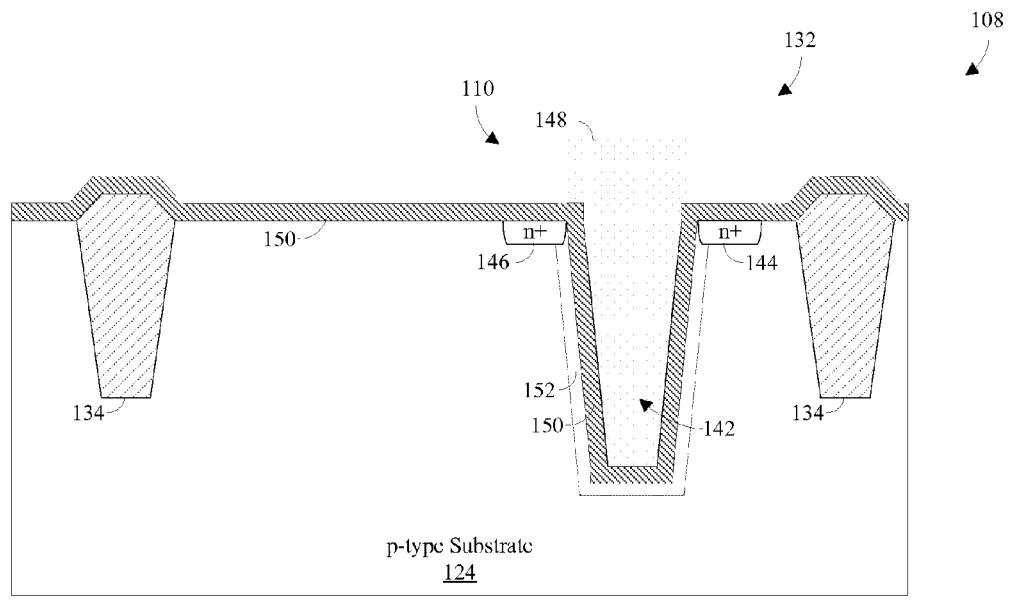

With the vertical trench 142 lined, the vertical trench 142 is filled (Action 214) with a conductive material 156 (see FIG. 6F) to form the vertical transfer gate 148. The conductive material 156 is typically polysilicon, but other gate materials, such as metal, are amenable. In some embodiments, the filling is performed by depositing the conductive material 156 to fill the vertical trench 142 and to coat the surface of the semiconductor substrate 124. Thereafter, a layer of photoresist 158 (See FIG. 6F) is deposited on the conductive material 156, and the photoresist 158 is patterned to mask the vertical trench 142. FIG. 6F illustrates a cross sectional view of the individual pixel sensor 108 at this stage of manufacture. With the photoresist 158 patterned, the semiconductor substrate 124 is etched to remove the conductive material 156 that isn't over the vertical trench 142. FIG. 6G illustrates a cross sectional view of the individual pixel sensor 108 at this stage of manufacture. Finally, the remaining photoresist 158 is removed.

Where the semiconductor substrate 124 does not yet include the source and drain regions 144, 146, the source and drain regions 144, 146 are embedded (Action 216) within the semiconductor substrate 124 on opposing sides of the vertical trench 142 and in communication with the inversion channel region 152. FIG. 6H illustrates a cross sectional view of the vertical-gate transfer transistor 110 at this stage of manufacture. In some embodiments, the high κ dielectric 150 is first etched back over the source and drain regions 144, 146 before embedding the source and drain regions 144, 146 in the semiconductor substrate 124.

Figure 6I:
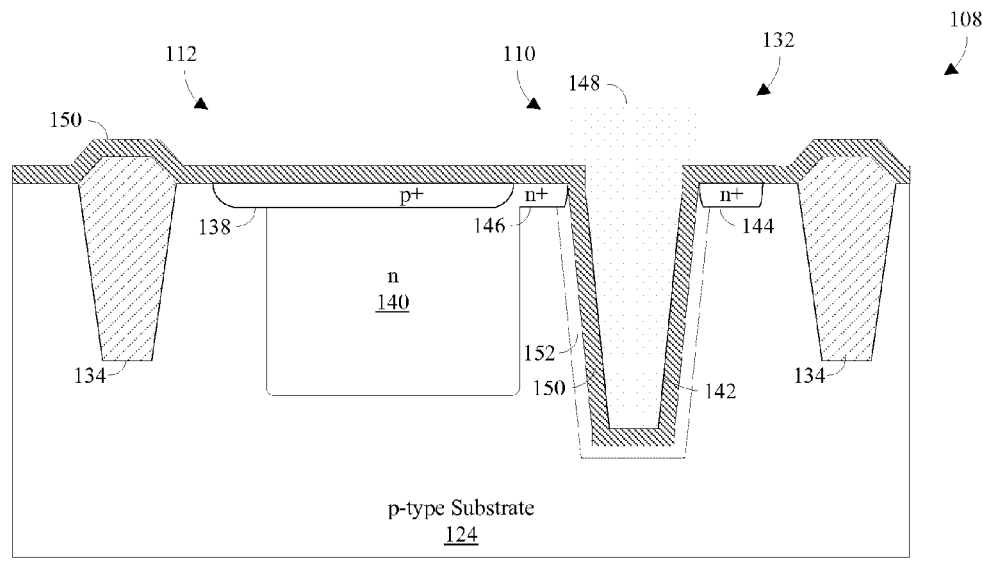

In addition to forming the transfer transistor 110, a photodiode 112 is also formed (Action 218) in the pixel sensor area 132. FIG. 6I illustrates a cross sectional view of the individual pixel sensor 108 at this stage of manufacture. The specific approach by which the photodiode 112 is formed is beyond the scope of the present disclosure. However, it is to be understood that any approach can be employed. In some embodiments, the photodiode 112 is formed to include an anode region 138 and a cathode region 140 embedded within the surface of the semiconductor substrate 124. The anode and cathode regions 138, 140 are of opposite types (n- or p-type). Typically, the anode region 138 is at least partially embedded within the cathode region 140 to form a p-n junction.

In view of the foregoing, the present disclosure provides a vertical-gate transfer transistor of an APS. The vertical-gate transfer transistor can be a semiconductor structure or an integrated circuit. The transistor includes a semiconductor substrate, a vertical trench extending into the semiconductor substrate, a dielectric lining the vertical trench, and a vertical gate filling the lined vertical trench. The vertical-gate transfer transistor employs a dielectric including a dielectric constant exceeding 3.9 (i.e., the dielectric constant of SiO2).

The present disclosure further provides an APS of a CIS comprising a vertical-gate transfer transistor of an APS. The transistor includes a semiconductor substrate, a vertical trench extending into the semiconductor substrate, a dielectric lining the vertical trench, and a vertical gate filling the lined vertical trench. The vertical-gate transfer transistor employs a dielectric including a dielectric constant exceeding 3.9 (i.e., the dielectric constant of SiO2).

The present disclosure also provides a method of manufacturing a vertical-gate transfer transistor of an APS. The method includes receiving a semiconductor substrate, forming a vertical trench extending into the semiconductor substrate, depositing a dielectric with a dielectric constant exceeding 3.9 to line the vertical trench, and filling the lined vertical trench with a conductive material to form a vertical gate.

The present disclosure moreover provides an APS comprising a photodiode and a vertical-gate transfer transistor. The photodiode is configured to convert incident light to electrical charge, and the vertical-gate transfer transistor is configured to transfer charge accumulated by the photodiode to a charge storage node. The transfer transistor includes a vertical gate insulated by a dielectric with a dielectric constant exceeding that of silicon dioxide.

The present disclosure even more provides an image sensor comprising a plurality of active pixel sensors (APS). Each APS includes a photodiode and a vertical-gate transfer transistor. The photodiode is configured to convert incident light to electrical charge, and the vertical-gate transfer transistor is configured to transfer charge accumulated by the photodiode to a charge storage node. The transfer transistor includes a vertical gate insulated by a dielectric with a dielectric constant exceeding that of silicon dioxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An active pixel sensor (APS) comprising:
   a photodiode arranged in a semiconductor substrate, laterally adjacent to a vertical trench, wherein the photodiode is configured to convert incident radiation to electrical charge and to accumulate the electrical charge;
   a vertical-gate transfer transistor configured to selectively transfer the accumulated charge to a charge storage node for read-out, wherein the vertical-gate transfer transistor includes a dielectric layer lining the vertical trench and a vertical gate filling the vertical trench over the dielectric layer, wherein the dielectric layer has a dielectric constant exceeding that of silicon dioxide, and wherein the vertical gate extends from a point over the photodiode to a point below the photodiode;
   a shallow trench isolation (STI) region extending into the semiconductor substrate to a first depth, and laterally surrounding the photodiode and the vertical-gate transfer transistor; and
   a deep trench isolation (DTI) region extending into the semiconductor substrate to a second depth greater than the first depth, laterally surrounding the STI region, and restricted to a periphery of a multi-pixel sensor array to which the APS belongs;
   wherein the dielectric layer covers the STI and DTI regions and comprises an opening exposing the photodiode and source and drain regions on opposing sides of the vertical trench.

2. The APS according to claim 1, wherein the dielectric layer includes one or more of hafnium oxide ($HfO_2$), aluminum oxide ($AlO_3$), and tantalum pentoxide ($Ta_2O_5$).

3. The APS according to claim 1, wherein the dielectric layer has a thickness of about 30-500 angstroms.

4. The APS according to claim 1, wherein the vertical gate extends vertically into the semiconductor to a depth that is intermediate the first and second depths.

5. The APS according to claim 1, further comprising:
   a reset transistor configured to selectively connect a power source to the charge storage node;
   a source follower transistor comprising a gate electrically coupled to the charge storage node; and
   a row select transistor configured to selectively couple the source follower transistor to an output;
   wherein the source follower transistor is configured to selectively couple the power source to the row select transistor.

6. An active pixel sensor (APS) comprising:
   a photodiode arranged in a semiconductor substrate, laterally adjacent to a vertical trench, wherein the photodiode is configured to convert incident radiation to electrical charge and to accumulate the electrical charge;
   a vertical-gate transfer transistor configured to selectively transfer the accumulated charge to a charge storage node for read-out, wherein the vertical-gate transfer transistor comprises a dielectric layer lining the vertical trench and a vertical gate filling the vertical trench over the dielectric layer, and wherein the dielectric layer has a dielectric constant exceeding about 3.9;
   a first isolation region extending vertically into the semiconductor substrate to a first depth, and laterally surrounding the photodiode and the vertical-gate transfer transistor; and
   a second isolation region extending vertically into the semiconductor substrate to a second depth greater than the first depth, and laterally surrounding the first isolation region, the photodiode, and the vertical-gate transfer transistor;
   wherein the vertical gate extends vertically into the semiconductor substrate to a depth that is intermediate the first and second depths and the vertical-gate transfer transistor extends from a point over the photodiode to a point below the photodiode;
   wherein the dielectric layer covers the first and second isolation regions and comprises an opening exposing the photodiode and source and drain regions on opposing sides of the vertical trench; and
   wherein the APS is one of a plurality of pixel sensors in a pixel sensor array, and wherein the second isolation region is restricted to a periphery of the pixel sensor array.

7. The APS according to claim 6, wherein the dielectric layer includes one or more of hafnium oxide ($HfO_2$), aluminum oxide ($AlO_3$), and tantalum pentoxide ($Ta_3O_5$).

8. The APS according to claim 6, further comprising:
- a reset transistor configured to selectively connect a power source to the charge storage node;
- a source follower transistor comprising a gate electrically coupled to the charge storage node; and
- a row select transistor configured to selectively couple the source follower transistor to an output;
- wherein the source follower transistor is configured to selectively couple the power source to the row select transistor.

9. The APS according to claim 6, wherein the first isolation region is a shallow trench isolation (STI) region and the second isolation region is a deep trench isolation (DTI) region.

10. An image sensor comprising a plurality of active pixel sensors (APS), each APS according to the APS of claim 6.

11. The APS according to claim 6, wherein the dielectric layer has a thickness of about 30-500 angstroms.

12. The APS according to claim 6, further comprising:
- a source follower transistor having a gate selectively connected to the photodiode by the vertical-gate transfer transistor.

* * * * *